(12) United States Patent
Lee et al.

(10) Patent No.: US 12,401,328 B2
(45) Date of Patent: Aug. 26, 2025

(54) SYSTEM AND METHOD FOR DISABLING Wi-Fi ON THE HANDHELD CONSOLE

(71) Applicant: Fully Loaded Electronics, LLC, Everett, WA (US)

(72) Inventors: Rachelle Lee, Mill Creek, WA (US); Byum Lee, Mill Creek, WA (US)

(73) Assignee: Fully Loaded Electronics, LLC, Everett, WA (US)

( * ) Notice: Subject to any disclaimer, the term of this patent is extended or adjusted under 35 U.S.C. 154(b) by 234 days.

(21) Appl. No.: 17/973,337

(22) Filed: Oct. 25, 2022

(65) Prior Publication Data

US 2023/0188101 A1 Jun. 15, 2023

Related U.S. Application Data

(60) Provisional application No. 63/288,952, filed on Dec. 13, 2021.

(51) Int. Cl.
*H03F 3/195* (2006.01)
*H03F 3/20* (2006.01)

(52) U.S. Cl.
CPC ............... *H03F 3/195* (2013.01); *H03F 3/20* (2013.01); *H03F 2200/451* (2013.01)

(58) Field of Classification Search
CPC ....... H03F 3/195; H03F 3/20; H03F 2200/451
USPC .......................................................... 463/37
See application file for complete search history.

(56) References Cited

U.S. PATENT DOCUMENTS

| | | | |
|---|---|---|---|
| 5,444,298 A * | 8/1995 | Schutz | H01L 23/49822 257/E23.079 |
| 6,832,093 B1 * | 12/2004 | Ranta | H04W 48/04 455/565 |
| 10,045,177 B2 * | 8/2018 | Park | H04W 4/60 |
| 2004/0101295 A1 | 5/2004 | Clark | |
| 2007/0017697 A1 * | 1/2007 | Hsu | H05K 3/4602 174/262 |
| 2007/0060212 A1 | 3/2007 | Shah | |
| 2014/0062589 A1 * | 3/2014 | Schenk | H03F 3/68 361/290 |
| 2014/0273885 A1 | 9/2014 | Chen | |
| 2017/0123562 A1 * | 5/2017 | Cletheroe | G06F 3/0354 |

FOREIGN PATENT DOCUMENTS

| | | |
|---|---|---|
| EP | 2 020 752 A1 | 2/2009 |
| WO | 99/09711 A1 | 2/1999 |

* cited by examiner

*Primary Examiner* — Allen Chan
(74) *Attorney, Agent, or Firm* — Seed Intellectual Property Law Group LLP

(57) ABSTRACT

A system and method for disabling the Wi-Fi on a handheld console whereby the handheld console may have an integrated chip that is a ball grid array whereby each solder ball provides certain voltages or data signals whereby the approach will be determined based on the specific handheld console as well as other factors including new manufacturer integrated chips, chipset architecture, software/firmware changes, or where is the best location on the handheld console for each circuit line to apply the short cut for the circuit to not be completed by either diverting the signal to another location on the logic board such as ground or creating an open line.

14 Claims, 2 Drawing Sheets

SYSTEM AND METHOD FOR DISABLING Wi-Fi ON THE HANDHELD CONSOLE

CROSS REFERENCE TO RELATED APPLICATIONS

This application claims priority to U.S. Provisional Patent No. 63/288,952 filed on Dec. 13, 2021, which is incorporated in its entirety.

FIELD OF THE DISCLOSURE

This relates generally to wireless communication between computing devices, and more particularly to the selective disabling of a set of a handheld device by having the user actively disable the Wi-Fi module associated with the set of handheld device.

BACKGROUND

The video game industry has become larger than ever and has spawned many innovations in both software and related hardware where users across the globe may communicate with one another. Computing devices such as desktop computers, laptop computers, mobile phones, smartphones, watches, tablet devices, and handheld consoles are more popular now than ever. In some instances, handheld consoles can communicate wirelessly over wireless networks. For example, handheld consoles can communicate over wireless networks based on the Institute of Electrical and Electronics Engineers (IEEE) 802.11 family of standards, also referred to as "Wi-Fi". The standards (including 802.11a, 802.11b, and 802.11g) define frequency, modulation, data rates, and message formats for communicating information and interacting with other handheld consoles. There are a plurality of reasons to permanently disable the Wi-Fi such as parental controls, or even when users cannot interact with the outside world such as from prison or a reality show. Some handheld consoles only have a Wi-Fi Chip module that is an integrated chip that controls WLAN, Bluetooth, and also functions as a Power Management Chip. It is difficult to reverse engineer the circuitry to remove only Wi-Fi functionality because 3 different important functions all work off one chip. Given the complexity of the integrated chip, currently there are only a few conceptually possible hardware solutions to disable Wi-Fi functionality only: permanently enable airplane mode via hardware, turn off the receiver antenna so no signal can be broadcast, or disrupt the Wi-Fi signal but these methods can be time-consuming and not fail safe. Thus, there exists the need for a new method to disable the Wi-Fi on a handheld console.

BRIEF DESCRIPTION OF THE DRAWINGS

Embodiments of the present disclosure are described in detail below with reference to the following drawings. These and other features, aspects, and advantages of the present disclosure will become better understood with regard to the following description, appended claims, and accompanying drawings. The drawings described herein are for illustrative purposes only of selected embodiments and not all possible implementations and are not intended to limit the scope of the present disclosure.

DETAILED DESCRIPTION

Figure 1:
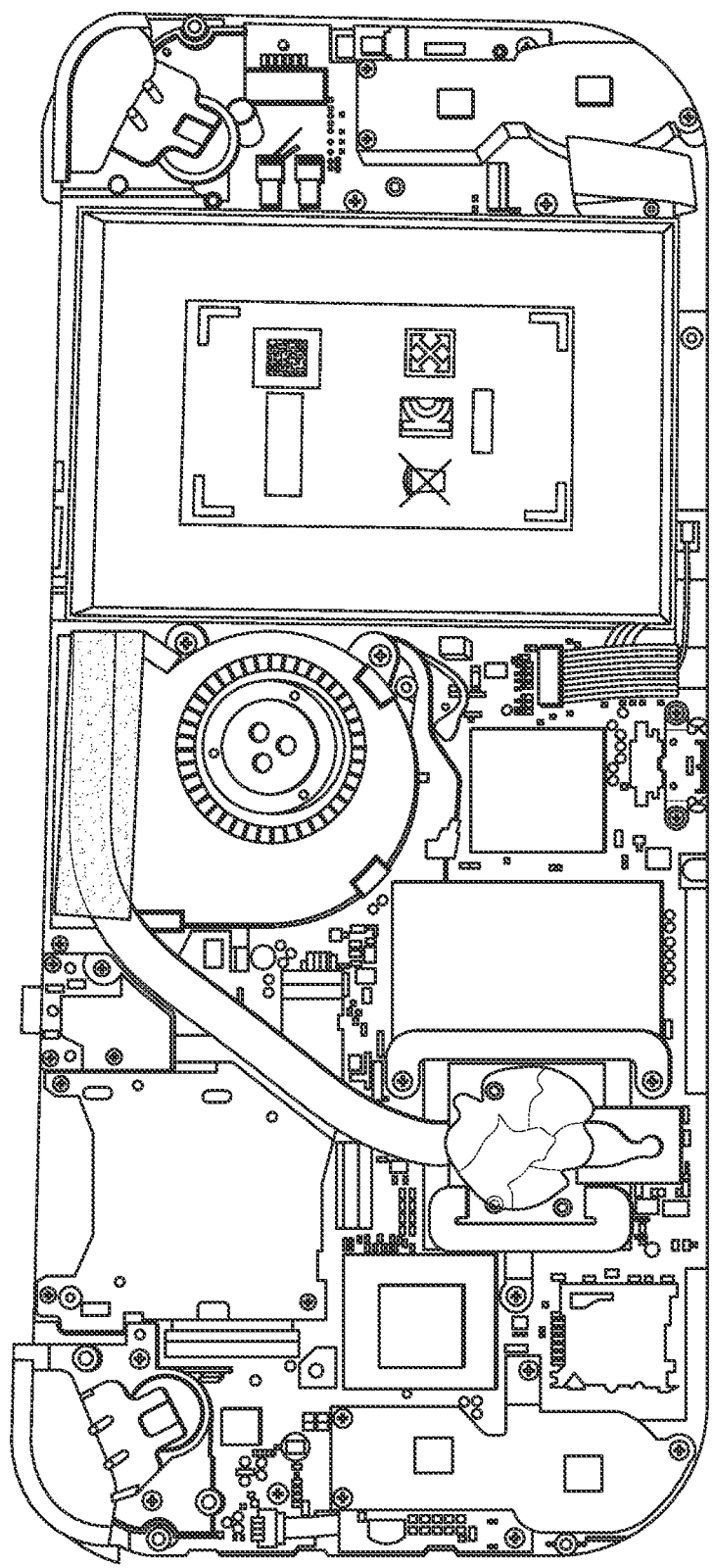
FIG. 1 is an illustration of the wireless module PCB.

In the Summary above and in this Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

The term "comprises" and grammatical equivalents thereof are used herein to mean that other components, ingredients, steps, among others, are optionally present. For example, an article "comprising" (or "which comprises") components A, B, and C can consist of (i.e., contain only) components A, B, and C, or can contain not only components A, B, and C but also contain one or more other components.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number (which may be a range having an upper limit or no upper limit, depending on the variable being defined). For example, "at least 1" means 1 or more than 1. The term "at most" followed by a number is used herein to denote the end of a range ending with that number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and upper limit is the second number. For example, 25 to 100 mm means a range whose lower limit is 25 mm and upper limit is 100 mm.

Certain terminology and derivations thereof may be used in the following description for convenience in reference only and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

Figure 2:
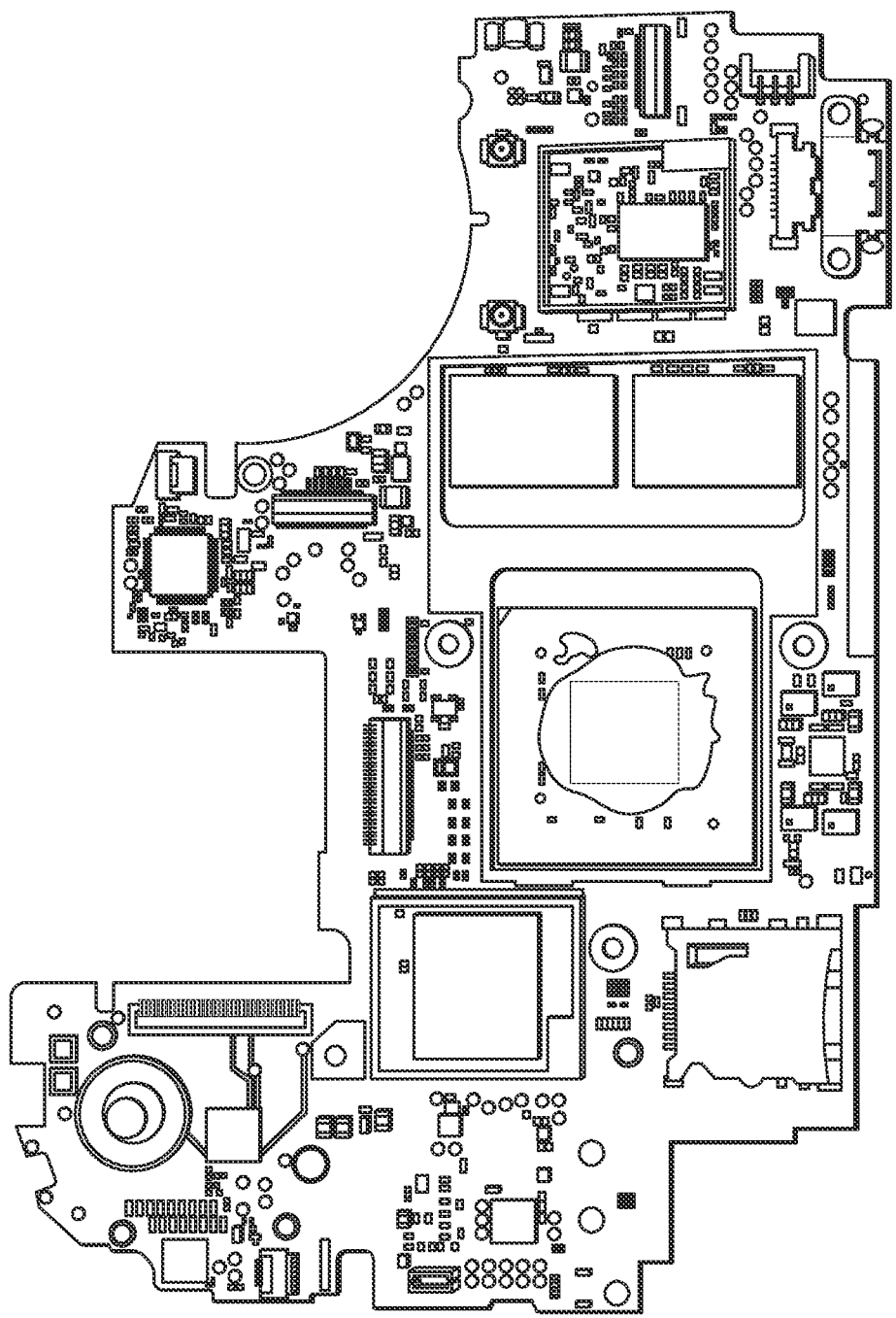
FIG. 2 is an illustration of the wireless module PCB with the shield removed.

The present description includes one or more embodiments for disabling the Wi-Fi on a handheld console such as but not limited to the Nintendo Switch Lite®. The handheld console may have an integrated chip that is a BGA (ball grid array) whereby each solder ball provides certain voltages or data signals. The integrated chip may be positioned on a logic board which has solder pads connecting to the integrated chip, as illustrated in FIGS. 1 and 2. The solder balls on the logic board connect to other components that allow handheld consoles to operate and provide certain functions for a user.

To disable the Wi-Fi or other connections on a handheld console, the approach will be determined based on the specific handheld console as well as other factors such as the new manufacturer integrated chips, chipset architecture, software/firmware changes, and/or the best location on the handheld console for each circuit line to apply the short cut for the circuit to not be completed by either diverting the signal to another location on the logic board such as ground or creating an open line.

In one non-limiting embodiment, an open line may be created from a specific BGA circuit whereby the circuit is then shorted using a capacitor on the BGA circuit line that redirects the signal to create an incomplete circuit. This method affects five total solder connections under the integrated chip whereby they would then be circumvented by re-routing the power signal to ground and not allowing the signal to fully complete for the designed circuit. In this embodiment, the five solder connections affected may be two power amplifier circuits, one input output radio frequency signal, a 3.3 v power signal to the integrated chip, and a 3.3 v power signal for a low dropout regulator.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. The present invention according to one or more embodiments described in the present description may be practiced with modification and alteration within the spirit and scope of the appended claims. Thus, the description is to be regarded as illustrative instead of restrictive of the present invention.

What is claimed is:

1. A method for disabling communications on a handheld videogame console by creating an open line in a circuit that includes a first amplifier circuit and a second amplifier circuit, wherein creating the open line affects an input output radio frequency signal, a 3.3 volt power signal to an integrated chip, and a second power signal for a low dropout regulator such that a user is able to use the handheld videogame console while not being able to connect to a network.

2. The method of claim 1, wherein creating the open line includes:
creating the open line in a BGA circuit.

3. The method of claim 1, wherein the second power signal is 3.3 volts.

4. A method for disabling communications on a handheld video game console by creating an open line in a circuit that includes a first amplifier circuit and a second amplifier circuit by shorting the circuit using a capacitor on a circuit line that redirects a signal to create an incomplete circuit such that a user is able to use the handheld videogame console while not being able to connect to a network, wherein creating the open line affects an input output radio frequency signal, a 3.3 volt power signal to an integrated chip, and a second power signal for a low dropout regulator.

5. The method of claim 4, wherein the circuit is a BGA circuit.

6. The method of claim 5, wherein the circuit line is a BGA circuit line.

7. The method of claim 4, wherein the second power signal is 3.3 volts.

8. A method for disabling communications on a handheld videogame console by creating an open line to affect five solder connections of an integrated chip such that a user is able to use the handheld videogame console while not being able to connect to a network.

9. The method of claim 8, wherein creating the open line includes:
creating the open line in a circuit that includes a first amplifier circuit.

10. The method of claim 8, wherein creating the open line includes:
creating the open line in a circuit that includes a second amplifier circuit.

11. The method of claim 8, wherein creating the open line includes:
creating the open line to affect an input output radio frequency signal.

12. The method of claim 8, wherein creating the open line includes:
creating the open line to affect a power signal to an integrated chip.

13. The method of claim 11, wherein the power signal is 3.3 volts.

14. The method of claim 8, wherein creating the open line includes:
affecting a second power signal for a low dropout regulator.

* * * * *